United States Patent
Wu

(10) Patent No.: US 12,345,919 B2
(45) Date of Patent: Jul. 1, 2025

(54) PHOTONICS CHIPS WITH THERMAL MANAGEMENT FOR A CAVITY-MOUNTED CHIP

(71) Applicant: GlobalFoundries U.S. Inc., Malta, NY (US)

(72) Inventor: Zhuojie Wu, Port Chester, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 342 days.

(21) Appl. No.: 18/105,304

(22) Filed: Feb. 3, 2023

(65) Prior Publication Data
US 2024/0264374 A1 Aug. 8, 2024

(51) Int. Cl.
| | |
|---|---|
| G02B 6/42 | (2006.01) |
| G02B 6/122 | (2006.01) |
| G02B 6/136 | (2006.01) |
| H01L 23/38 | (2006.01) |
| H01L 23/48 | (2006.01) |
| G02B 6/12 | (2006.01) |

(52) U.S. Cl.
CPC .......... *G02B 6/1228* (2013.01); *G02B 6/136* (2013.01); *G02B 6/4201* (2013.01); *H01L 23/38* (2013.01); *H01L 23/481* (2013.01); G02B 2006/12121 (2013.01)

(58) Field of Classification Search
CPC ............................ H01L 23/28; G02B 6/4201
See application file for complete search history.

(56) References Cited

U.S. PATENT DOCUMENTS

| | | | | |
|---|---|---|---|---|
| 5,040,381 | A * | 8/1991 | Hazen | F25B 21/02 62/3.1 |
| 7,560,640 | B2 * | 7/2009 | Hu | H10N 10/01 136/224 |
| 7,586,125 | B2 * | 9/2009 | Dai | H10H 20/8584 257/E27.008 |
| 8,030,113 | B2 | 10/2011 | Hsu et al. | |
| 9,228,763 | B2 * | 1/2016 | Kim | H10N 10/17 |
| 9,913,405 | B2 * | 3/2018 | Gambino | H01L 23/49827 |
| 10,043,962 | B2 | 8/2018 | Mandal et al. | |
| 10,210,912 | B2 | 2/2019 | Huang | |

(Continued)

OTHER PUBLICATIONS

Luciana W. da Silva, Massoud Kaviany, "Micro-thermoelectric cooler: interfacial effects on thermal and electrical transport." International Journal of Heat and Mass Transfer, vol. 47, Issues 10-11, 2004, pp. 2417-2435, ISSN 0017-9310, https://doi.org/10.1016/j.ijheatmasstransfer.2003.11.024.

(Continued)

*Primary Examiner* — Charlie Y Peng
(74) *Attorney, Agent, or Firm* — Thompson Hine LLP; Anthony Canale

(57) ABSTRACT

Structures for a cavity-mounted chip and methods of fabricating a structure for a cavity-mounted chip. The structure comprises a substrate including a cavity, a thermoelectric device inside the cavity, and a chip disposed inside the cavity adjacent to the thermoelectric device. The thermoelectric device includes a first plurality of pillars and a second plurality of pillars that alternate with the first plurality of pillars in a series circuit, the first plurality of pillars comprising an n-type semiconductor material, and the second plurality of pillars comprising a p-type semiconductor material.

20 Claims, 7 Drawing Sheets

(56) References Cited

U.S. PATENT DOCUMENTS

| | | | |
|---|---|---|---|
| 11,011,886 B2* | 5/2021 | Gelhausen | H01S 5/0233 |
| 2002/0046762 A1* | 4/2002 | Rossi | H10N 10/853 |
| | | | 136/238 |
| 2004/0114869 A1* | 6/2004 | Fike | G02B 6/1228 |
| | | | 385/28 |
| 2016/0282194 A1* | 9/2016 | Barnett | H10N 10/01 |
| 2020/0310052 A1* | 10/2020 | Lim | H01L 21/56 |
| 2022/0006253 A1* | 1/2022 | Li | G02B 6/4207 |

OTHER PUBLICATIONS

H. Oprins, Y. Ban, V. Cherman and J. V. Campenhout, "Thermal Aspects of Silicon Photonic Interposer Packages," 2020 21st International Conference on Thermal, Mechanical and Multi-Physics Simulation and Experiments in Microelectronics and Microsystems (EuroSimE), 2020, pp. 1-6, doi: 10.1109/EuroSimE48426.2020.9152630.

R. Enright et al., "Integrated Thermoelectric Cooling for Silicon Photonics." 2017 ECS Journal of Solid State Science and Technology, vol. 6, No. 3, pp. N3103-N3112, DOI 10.1149/2.0151703jss, Feb. 16, 2017.

Y. Bian et al., "Hybrid III-V laser integration on a monolithic silicon photonic platform," in Optical Fiber Communication Conference (OFC) 2021, P. Dong, J. Kani, C. Xie, R. Casellas, C. Cole, and M. Li, eds., OSA Technical Digest (Optica Publishing Group, 2021), paper M5A.2.

Y. Bian et al., "3D Integrated Laser Attach Technology on 300-mm Monolithic Silicon Photonics Platform," 2020 IEEE Photonics Conference (IPC), 2020, pp. 1-2, doi: 10.1109/IPC47351.2020.9252280.

Y. Bian et al., "Integrated Laser Attach Technology on a Monolithic Silicon Photonics Platform," 2021 IEEE 71st Electronic Components and Technology Conference (ECTC), 2021, pp. 237-244, doi: 10.1109/ECTC32696.2021.00048.

B. Peng et al., "A CMOS Compatible Monolithic Fiber Attach Solution with Reliable Performance and Self-alignment," in Optical Fiber Communication Conference (OFC) 2020, OSA Technical Digest (Optica Publishing Group, 2020), paper Th31.4.

J. K. Cho et al., "Optical performance and reliability assessment from self-aligned single mode fiber attach for O-band silicon photonics platform," 2022 IEEE 72nd Electronic Components and Technology Conference (ECTC), 2022, pp. 403-409, doi: 10.1109/ECTC51906.2022.00072.

Wu, Zhuojie et al., "Cavity-Mounted Chips With Multiple Adhesives" filed Nov. 8, 2022 as a U.S. Appl. No. 17/982,606.

Wu, Zhuojie at al., "PIC Structure With Wire(s) Between Z-Stop Supports on Side of Optical Device Attach Cavity." filed Sep. 19, 2022 as a U.S. Appl. No. 17/933,199.

* cited by examiner

PHOTONICS CHIPS WITH THERMAL MANAGEMENT FOR A CAVITY-MOUNTED CHIP

BACKGROUND

This disclosure relates to photonics chips and, more specifically, to structures for a cavity-mounted chip and methods of fabricating a structure for a cavity-mounted chip.

Photonics chips are used in many applications and systems including, but not limited to, data communication systems and data computation systems. A photonics chip integrates optical components and electronic components into a unified platform. Among other factors, layout area, cost, and operational overhead may be reduced by the integration of both types of components on the same chip.

A photonics chip may include a laser source. In that regard, a cavity may be formed in the substrate, and a chip including the laser source may be inserted into the cavity and attached to the substrate. The laser source generates significant amount of heat during operation that is passively dissipated from the attachment locations to the substrate. The performance of the laser source and the reliability of the laser source are contingent upon effective thermal management, and passive heat dissipation may provide low-effectiveness thermal management.

Improved structures for a cavity-mounted chip and methods of fabricating a structure for a cavity-mounted chip are needed.

SUMMARY

In an embodiment of the invention, a structure for a photonics chip is provided. The structure comprises a substrate including a cavity, a thermoelectric device inside the cavity, and a chip disposed inside the cavity adjacent to the thermoelectric device. The thermoelectric device includes a first plurality of pillars and a second plurality of pillars that alternate with the first plurality of pillars in a series circuit, the first plurality of pillars comprise an n-type semiconductor material, and the second plurality of pillars comprise a p-type semiconductor material.

In an embodiment of the invention, a method of forming a structure for a photonics chip is provided. The method comprises forming a cavity in a substrate, forming a thermoelectric device inside the cavity, and disposing a chip inside the cavity adjacent to the thermoelectric device. The thermoelectric device includes a first plurality of pillars and a second plurality of pillars that alternate with the first plurality of pillars in a series circuit, the first plurality of pillars comprise an n-type semiconductor material, and the second plurality of pillars comprise a p-type semiconductor material.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
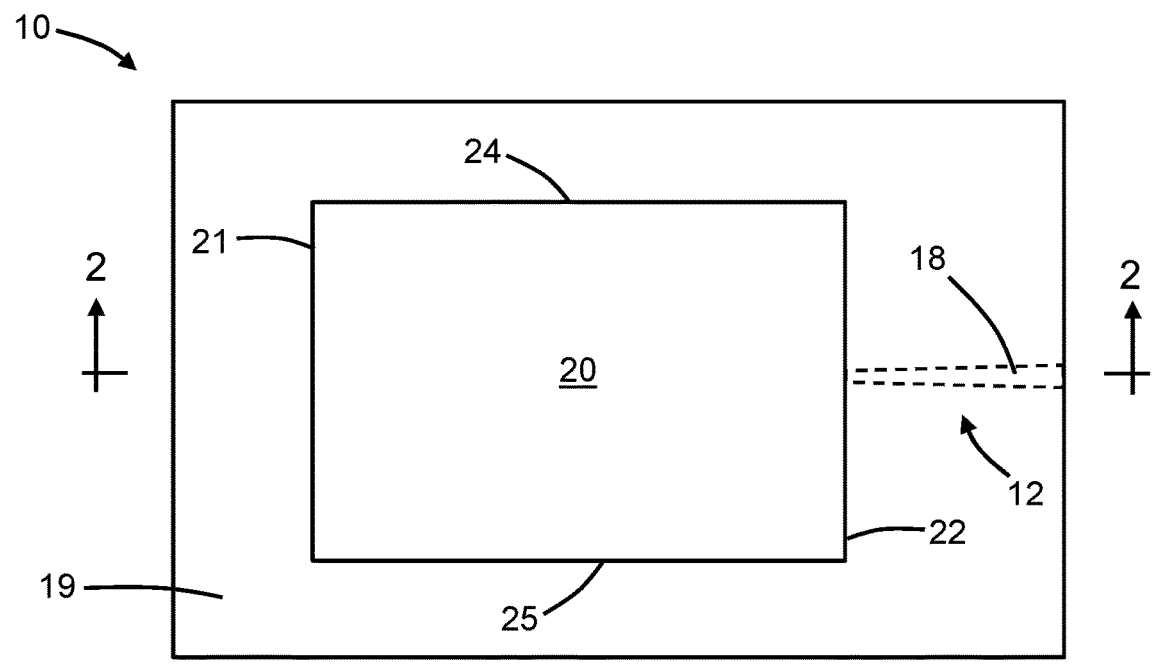
FIG. 1 is a top view of a structure at an initial fabrication stage of a processing method in accordance with embodiments of the invention.
Figure 2:
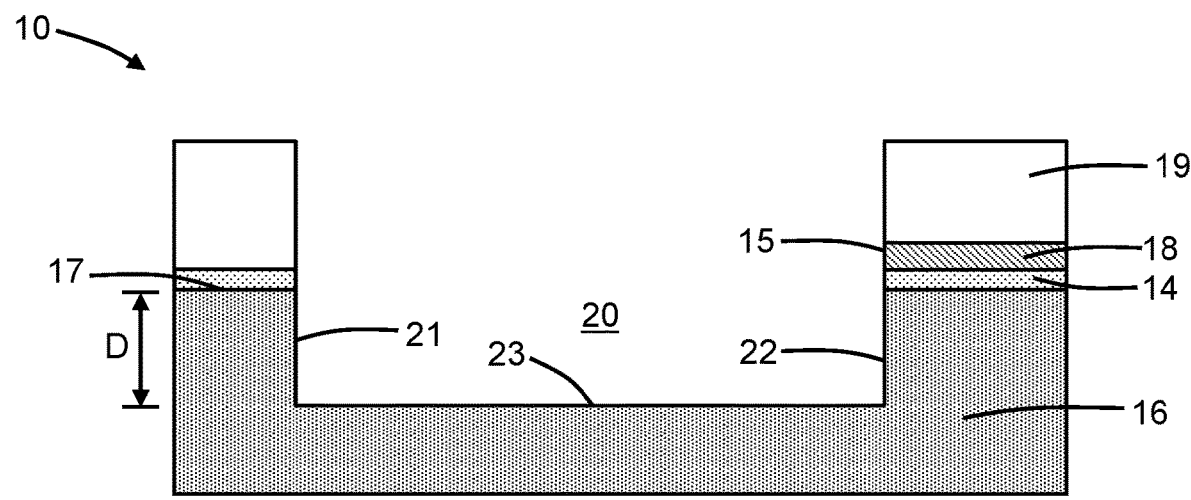
FIG. 2 is a cross-sectional view taken generally along line 2-2 in FIG. 1.

With reference to FIGS. 1, 2 and in accordance with embodiments of the invention, a structure 10 for a photonics chip includes a waveguide core 12 that is positioned on, and over, a substrate 16 and a dielectric layer 14 that is disposed on the substrate 16. In an embodiment, the dielectric layer 14 may be comprised of a dielectric material, such as silicon dioxide, and the substrate 16 may be comprised of a semiconductor material, such as single-crystal silicon. In an embodiment, the dielectric layer 14 may be a buried oxide layer of a silicon-on-insulator substrate, and the dielectric layer 14 may separate the waveguide core 12 from the substrate 16. In an alternative embodiment, one or more additional dielectric layers comprised of, for example, silicon dioxide may be positioned between the waveguide core 12 and the dielectric layer 14.

In an embodiment, the waveguide core 12 may be comprised of a material having a refractive index that is greater than the refractive index of silicon dioxide. In an embodiment, the waveguide core 12 may be comprised of a semiconductor material, such as single-crystal silicon or polysilicon. In an alternative embodiment, the waveguide core 12 may be comprised of a dielectric material, such as silicon nitride, silicon oxynitride, or aluminum nitride. In alternative embodiments, other materials, such as a polymer or a III-V compound semiconductor, may be used to form the waveguide core 12.

In an embodiment, the waveguide core 12 may be formed by patterning a layer of its constituent material with lithography and etching processes. In an embodiment, an etch mask may be formed by a lithography process over the layer, and unmasked sections of the layer may be etched and removed by an etching process. The shape of the etch mask may determine the patterned shape of the waveguide core 12. In an embodiment, the waveguide core 12 may be formed by patterning the semiconductor material (e.g., single-crystal silicon) of a device layer of a silicon-on-insulator substrate.

In an embodiment, the waveguide core 12 may include a tapered section 18 that defines a spot-size converter configured to receive light of a given mode from a light source, such as a laser chip. The tapered section 18 of the waveguide core 12 may terminate at a narrow end 15 defining a facet that is eventually arranged proximate to the light source and a wide end that is connected to another section of the waveguide core 12 used to route the light to functional circuits on the photonics chip. The width dimension of the tapered section 18 may increase with increasing distance from the end 15. The gradually-varying cross-section area and width dimension of the tapered section 18 may support mode transformation and mode size variation associated with mode conversion when receiving light from a light source.

A back-end-of-line stack 19 may be formed over the dielectric layer 14 and substrate 16. The back-end-of-line stack 19 may include multiple dielectric layers that are comprised of dielectric materials, such as silicon dioxide, silicon nitride, tetraethylorthosilicate silicon dioxide, or fluorinated-tetraethylorthosilicate silicon dioxide, and that are arranged in a layer stack on the dielectric layer 14 and substrate 16. The waveguide core 12 may be embedded in one or more of the dielectric layers of the back-end-of-line stack 19, or in a separate dielectric layer replacing a section of the back-end-of-line stack 19.

A cavity 20 is formed that penetrates through the dielectric layer 14 and into the substrate 16. The cavity 20 may be formed by one or more lithography and etching processes. The portion of the cavity 20 in the substrate 16 may extend to a bottom or floor 23 that is located at a depth D relative to a top surface 17 of the substrate 16. The portion of the cavity 20 in the substrate 16 includes a sidewall 21, a sidewall 22 opposite to the sidewall 21, a sidewall 24, and a sidewall 25 opposite to the sidewall 24. The sidewalls 21, 22 and the sidewalls 24, 25, which are arranged about the floor 23 of the cavity 20, may extend from the floor 23 of the cavity 20 to the top surface 17 of the substrate 16. The terminating end 15 of the tapered section 18 of the waveguide core 12 may be positioned adjacent to the sidewall 22 and opposite to the sidewall 21. An upper portion of the cavity 20 may also extend through the back-end-of-line stack 19.

Figure 3:
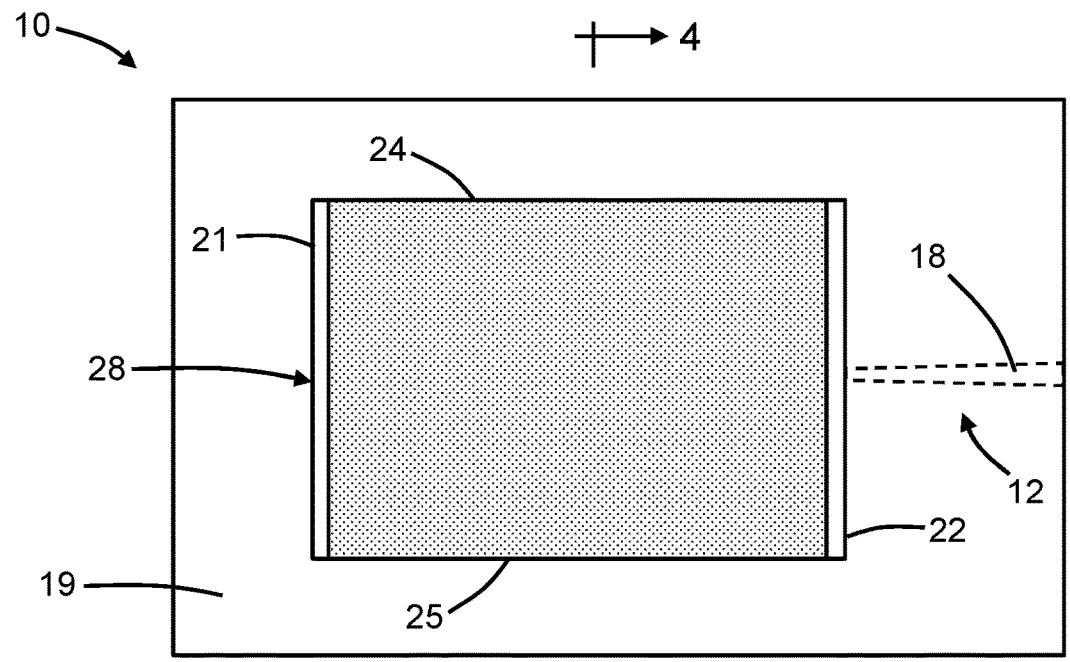
FIG. 3 is a top view of the structure at a fabrication stage subsequent to FIG. 1.
Figure 4:
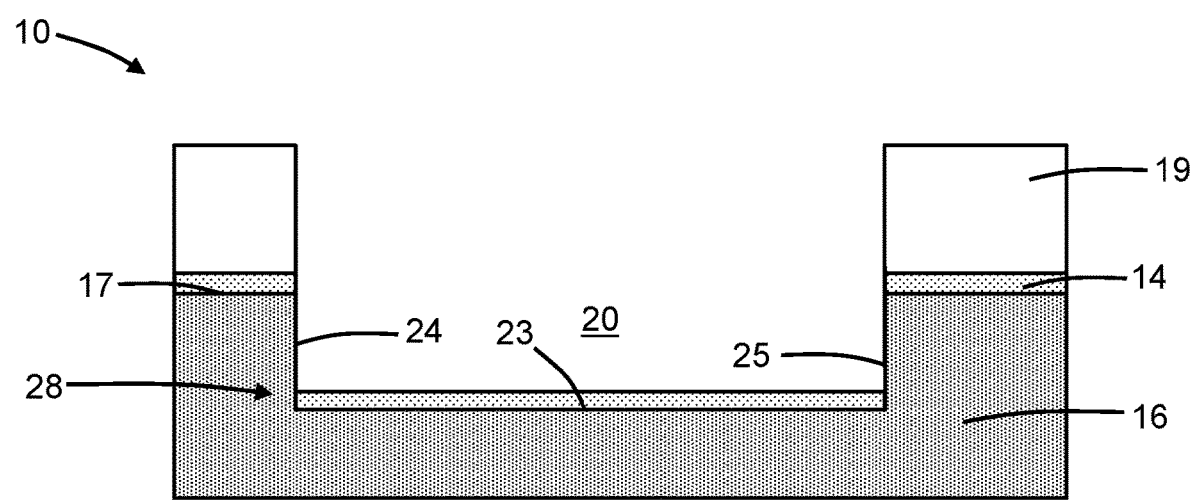
FIG. 4 is a cross-sectional view taken generally along line 4-4 in FIG. 3.
Figure 4A:
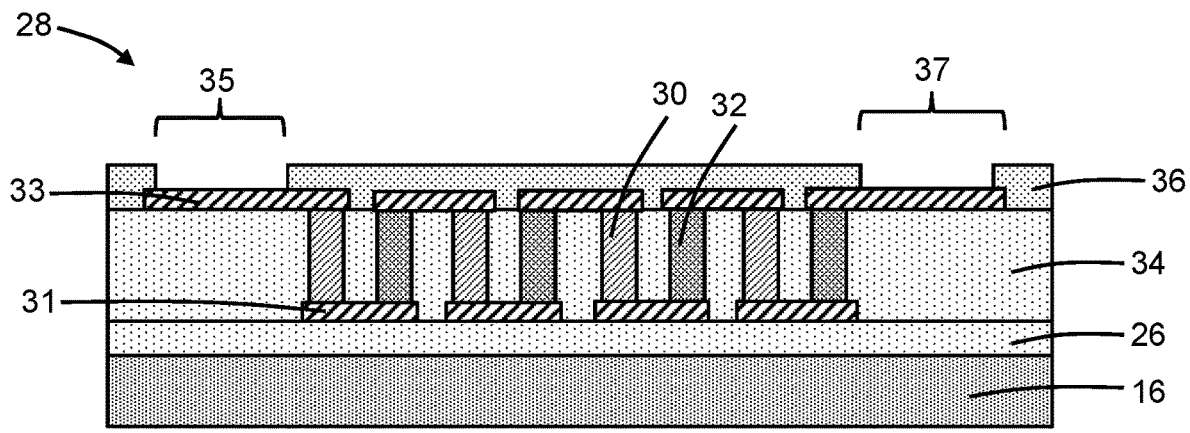
FIG. 4A is an enlarged view of a portion of FIG. 4.

With reference to FIGS. 3, 4, 4A in which like reference numerals refer to like features in FIGS. 1, 2 and at a subsequent fabrication stage, the structure 10 may include a thermoelectric device 28 that is disposed inside the cavity 20. In an embodiment, the thermoelectric device 28 may fully extend from the sidewall 24 to the sidewall 25. A dielectric layer 26 may be formed on the floor 23 of the cavity 20, and the thermoelectric device 28 may be disposed on the dielectric layer 26 over the floor 23 of the cavity 20.

As best shown in FIG. 4A, the thermoelectric device 28 may include pillars or sections 30 of a thermoelectric material and pillars or sections 32 of a different thermoelectric material. Adjacent pairs of the sections 30, 32 are connected by bottom connectors 31 and top connectors 33 to define a series circuit. The sections 30 alternate with the sections 32 in the series circuit. The sections 30, 32 of thermoelectric material are embedded in a dielectric layer 34, and a dielectric layer 36 is formed over the dielectric layer 34. Each pair of adjacent sections 30 and 32 defines a couple of the thermoelectric device 28.

In an embodiment, the thermoelectric material constituting the sections 30 may be a semiconductor material having an opposite conductivity type from the thermoelectric material constituting the sections 32. In an embodiment, the sections 30 may be comprised of an n-type semiconductor material, and the sections 32 may be comprised of a p-type semiconductor material. In an embodiment, the sections 30 may be comprised of bismuth telluride doped with selenium, and the sections 32 may be comprised of bismuth telluride doped with antimony. In an alternative embodiment, the sections 30 may be formed by patterning the dielectric layer 34 with lithography and etching processes to define openings extending to the bottom connectors 31, depositing a layer of the n-type thermoelectric material to fill the openings, and planarizing the deposited layer. In an embodiment, the sections 32 may be formed by patterning the dielectric layer 34 with a different set of lithography and etching processes to define openings extending to the bottom connectors 31, depositing a layer of the p-type thermoelectric material to fill the openings, and planarizing the deposited layer.

The dielectric layers 26, 34, 36 may be comprised of a dielectric material, such as aluminum nitride or boron nitride, that is an electrical insulator and that has a high thermal conductivity to enable efficient heat transfer from the hot side of the thermoelectric device 28 to the substrate 16. For example, the thermal conductivity of the layers 26, 34, 36 may be greater than the thermal conductivity of silicon dioxide. The bottom connectors 31 and the top connectors 33 may be comprised of a low-resistance metal, such as aluminum or copper.

Openings 35, 37 may be formed in the dielectric layer 36 to expose portions of the top connectors 33 at the side edges of the thermoelectric device 28. In an embodiment, wire bonds (not shown) may be formed that are connected to the portions of the top connectors 33 exposed by the openings 35, 37.

Figure 5:
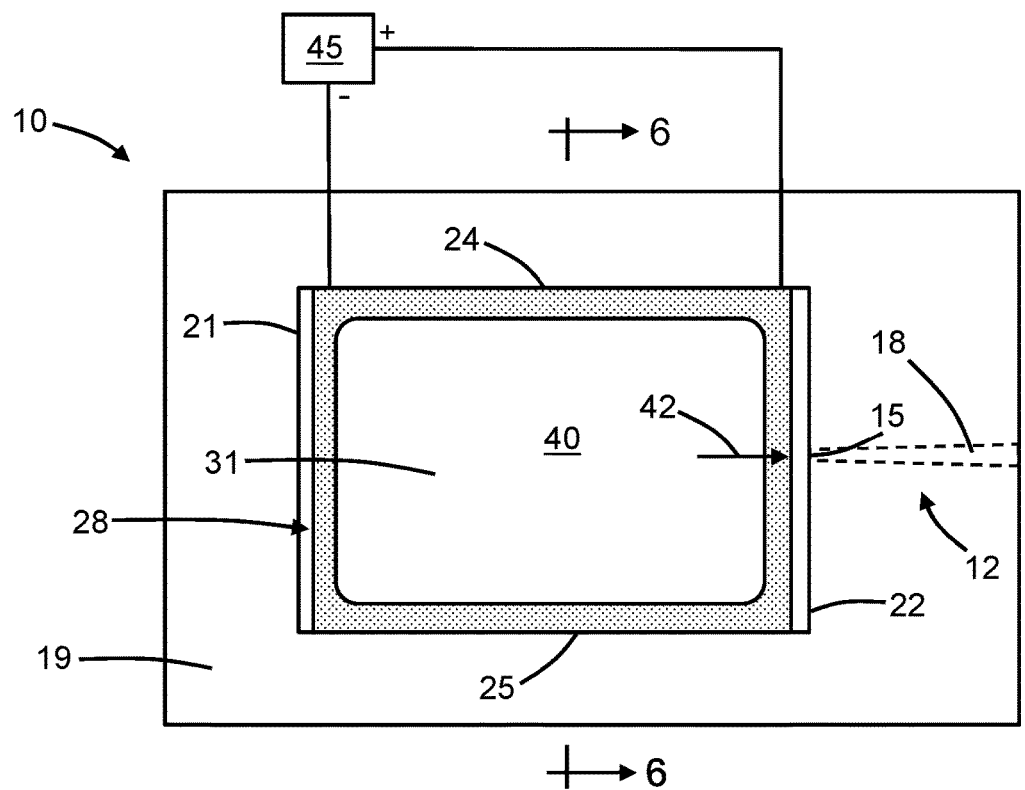
FIG. 5 is a top view of the structure at a fabrication stage subsequent to FIG. 3.
Figure 6:
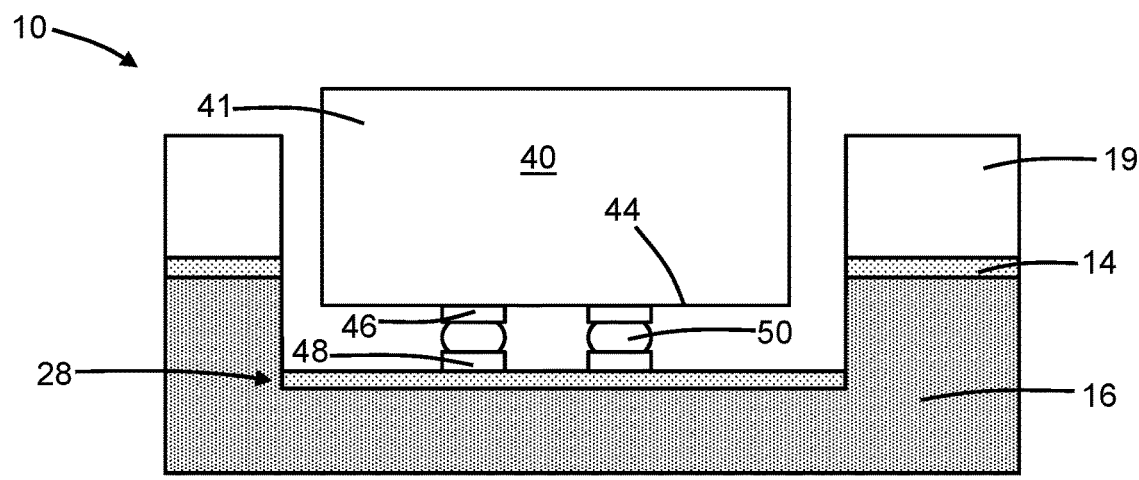
FIG. 6 is a cross-sectional view taken generally along line 6-6 in FIG. 5.

With reference to FIGS. 5, 6 in which like reference numerals refer to like features in FIGS. 3, 4 and at a subsequent fabrication stage, a laser chip 40 may be positioned inside the cavity 20. The shape and dimensions of the cavity 20 may be correlated with the shape and dimensions of the laser chip 40 such that the laser chip 40 can be inserted into the cavity 20. In that regard, the dimensions of the cavity 20 may be slightly greater than the dimensions of the laser chip 40 to provide clearance for insertion of the laser chip 40 into the cavity 20.

The laser chip 40 may be configured to emit light (e.g., laser light) of a given wavelength, intensity, mode shape, and mode size from an output 42. In an embodiment, the terminating end 15 of the tapered section 18 of the waveguide core 12 may be positioned adjacent to the output 42 of the laser chip 40. The output 42 from the laser chip 40 may be aligned with the terminating end 15 of the tapered section 18 of the waveguide core 12 in order to provide efficient light transfer.

In an embodiment, the laser chip 40 may include a laser comprised of one or more III-V compound semiconductor materials. In an embodiment, the laser chip 40 may include an indium phosphide/indium-gallium-arsenic phosphide laser that is configured to generate continuous laser light in an infrared wavelength range for emission from the output 42. For example, the laser included in the laser chip 40 may generate and output laser light at a nominal peak wavelength of 1310 nm or at a nominal peak wavelength of 1550 nm.

In an alternative embodiment, the laser chip 40 may include a semiconductor optical amplifier that is configured to amplify the optical power of laser light. An additional waveguide core similar to the waveguide core 12 may be provided to function as an input to the semiconductor optical amplifier, and the waveguide core 12 may provide an output from the semiconductor optical amplifier.

The laser chip 40 has a body 41 with a lower surface 44 that is spaced above the thermoelectric device 28. The laser chip 40 may have the form of a flip-chip package that includes pads 46 exposed at the lower surface 44. The pads 46 may be connected to active circuitry inside the body 41 of the laser chip 40. The pads 46 may be attached to redistribution layers 48 by solder joints 50. The attachment process may include inserting the laser chip 40 into the cavity 20 and reflowing solder bumps to form the solder joints 50 such that the laser chip 40 is mechanically and electrically connected to the redistribution layers 48. The redistribution layers 48, which may be comprised of a patterned metal (e.g., copper), may be disposed on the dielectric layer 36 of the thermoelectric device 28 and beneath the lower surface 44 of the laser chip 40. The cold side of the thermoelectric device 28 is interfaced with the laser chip 40 through heat conduction paths including the pads 46, redistribution layers 48, and solder joints 50. Although not shown, the redistribution layers 48 may include traces that extend up one or more of the sidewalls 21, 22, 24, 25 to pads located on a top surface of the back-end-of-line stack 19 and used to establish electrical connections to the laser chip 40.

The laser chip 40 may project above the back-end-of-line stack 19. Alternatively, the laser chip 40 may be recessed below the back-end-of-line stack 19. Alternatively, the laser chip 40 may be recessed below the back-end-of-line stack 19, and a lid may be attached to the back-end-of-line stack 19 over the cavity 20. In an embodiment, the gap between the lower surface 44 of the body 41 of the laser chip 40 and the thermoelectric device 28 may include an optical coupling adhesive.

A power supply 45 may have positive and negative terminals connected to the series circuit including the bottom connectors 31, the top connectors 33, and the sections 30, 32 of the thermoelectric device 28. The power supply 45 may supply a direct current to the thermoelectric device 28 with a current flow direction and a polarity that powers the thermoelectric device 28 to operate by the thermoelectric effect as a Peltier cooler. As a result, the thermoelectric device 28 may be used to extract heat from, and reduce the temperature of, the laser chip 40. In an embodiment, the positive and negative terminals of the power supply 45 may be coupled to the portions of the top connectors 33 at the side edges of the thermoelectric device 28 (FIG. 4A).

In use, the laser chip 40 may be operated to generate light supplied to the waveguide core 12, and the thermoelectric device 28 may be powered by the power supply 45. A temperature sensor may detect an increase in the temperature of the laser chip 40 relative to a desired temperature, and a feedback control block may be used to increase the current supplied from the power supply 45 to the thermoelectric device 28. A decrease in the temperature of the laser chip 40 relative to the desired temperature may be compensated by decreasing the current supplied from the power supply 45 to the thermoelectric device 28. Alternatively, a power sensor, such as a photodetector, may be used to detect a change in the optical power output from the laser chip 40 relative to a desired optical power output, and the feedback control block may either increase or decrease the current supplied from the power supply 45 to the thermoelectric device 28 in order to compensate for the change in the optical power output.

The thermoelectric device 28 may enable active thermal management of the laser chip 40 that is attached inside the cavity 20 to the substrate 16. The active thermal management may be significantly more efficient than passive thermal dissipation. The improved thermal management may lower the operating temperature of the laser chip 40, which may improve laser performance and reliability. The ability to control and reduce the operating temperature of the laser chip 40 may also enable higher-power laser applications.

Figure 7:
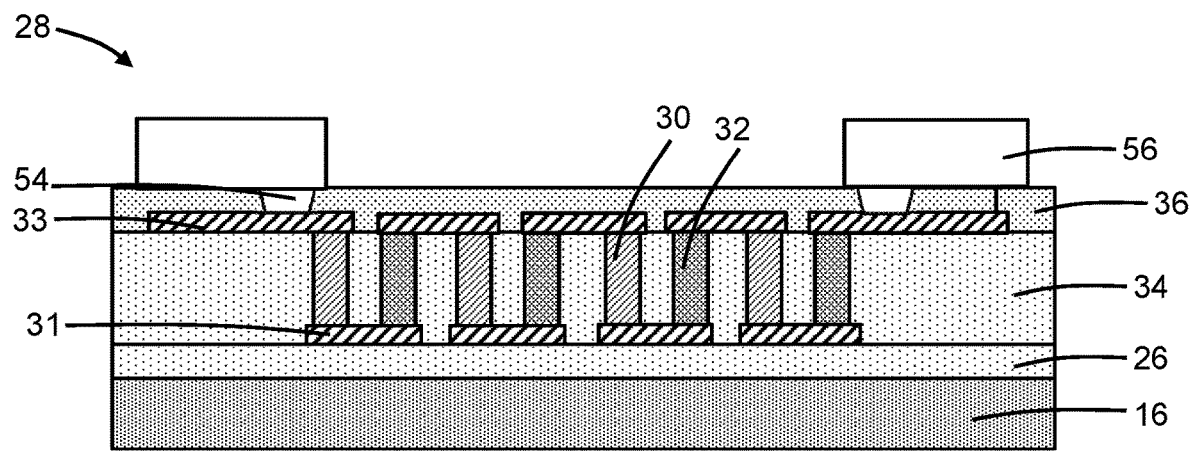
FIG. 7 is a cross-sectional view of a structure in accordance with alternative embodiments of the invention.

With reference to FIG. 7 and in accordance with alternative embodiments, the portions of the top connectors 33 exposed by the openings 35, 37 at the side edges of the thermoelectric device 28 may be contacted by contact vias 54. Pads 56 comprised of a conductor, such as gold, may be formed that are connected by the contact vias 54 with the exposed portions of the top connectors 33. The power supply 45 (FIG. 5) may be coupled to the pads 56.

Figure 8:
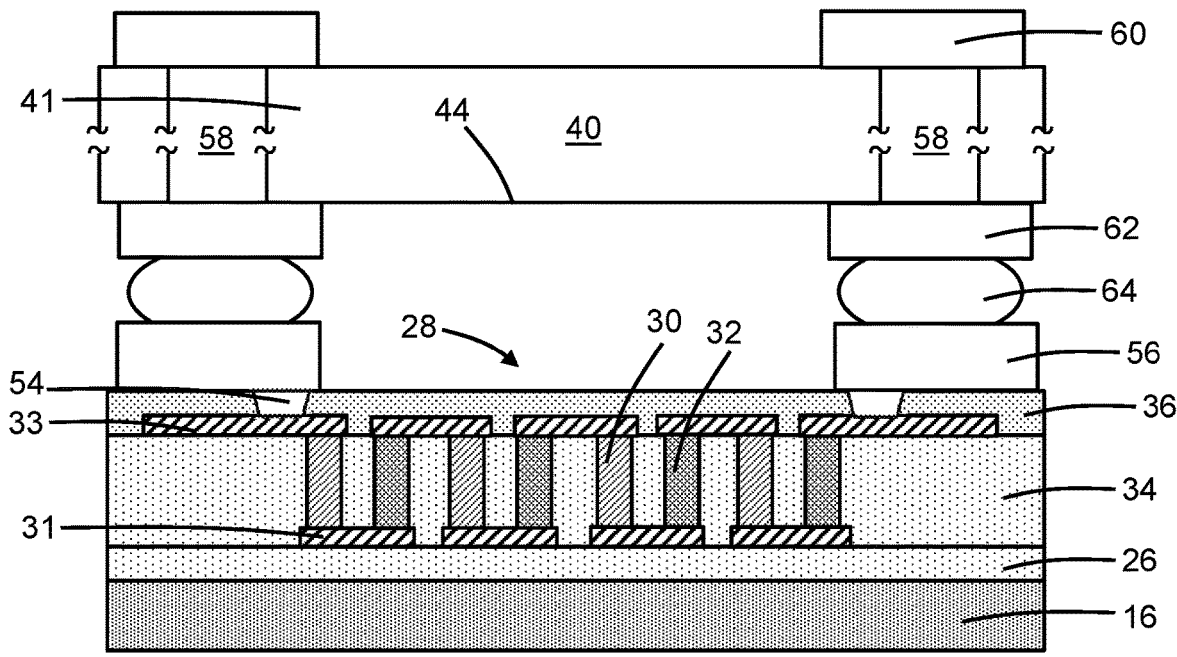
FIG. 8 is a cross-sectional view of a structure in accordance with alternative embodiments of the invention.

With reference to FIG. 8 and in accordance with alternative embodiments, the laser chip 40 may include through-silicon vias 58 that extend through the body 41 from wire bond pads 60 to pads 62 at the lower surface 44. The pads 62 may be attached to the pads 56 by solder joints 64. The through-silicon vias 58, which are coupled to the series circuit including the sections 30, 32 of the thermoelectric device 28, penetrate through the laser chip 40 to establish vertical electrical connections to the thermoelectric device 28. The power supply 45 (FIG. 5) may be coupled to the wire bond pads 60.

Figure 9:
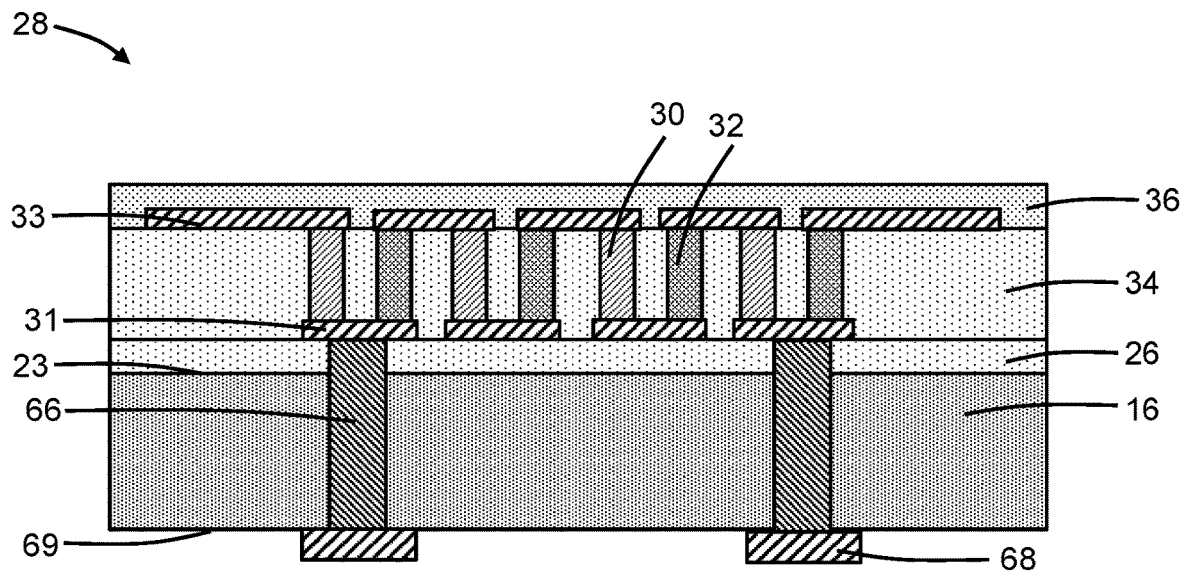
FIG. 9 is a cross-sectional view of a structure in accordance with alternative embodiments of the invention.

With reference to FIG. 9 and in accordance with alternative embodiments, the substrate 16 may include through-silicon vias 66 that extend through the substrate 16 from portions of the bottom connectors 31 at the side edges of the thermoelectric device 28 to pads 68 at a backside 69 of the substrate 16. The backside 69 of the substrate 16 is opposite to the top surface 17 of the substrate 16. The pads 68 at the backside 69 of the substrate 16 may be attached to a different substrate by reflowed solder. The through-silicon vias 66, which are coupled to the series circuit including the sections 30, 32 of the thermoelectric device 28, penetrate through the substrate 16 to establish vertical electrical connections to the thermoelectric device 28. The power supply 45 (FIG. 5) may be coupled to the pads 68. The through-silicon vias 66 may be fabricated by etching deep vias that extend from the floor 23 of the cavity 20 to the backside 69 of the substrate 16, filling the vias with a conductor, and then exposing the conductor by a backside reveal process.

Figure 10:
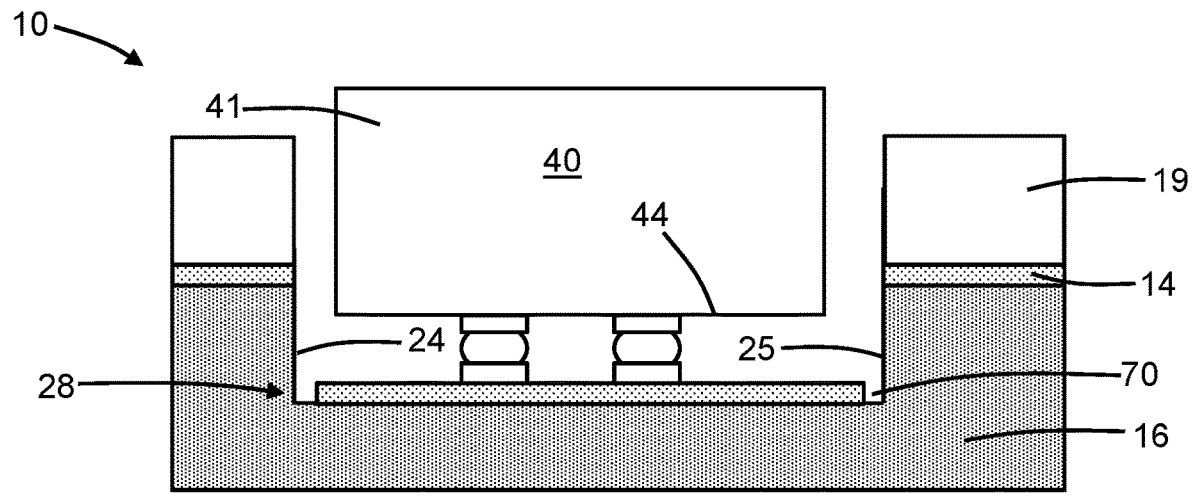
FIG. 10 is a cross-sectional view of a structure in accordance with alternative embodiments of the invention.

With reference to FIG. 10 and in accordance with alternative embodiments, gaps 70 may be disposed between the thermoelectric device 28 and the opposite sidewalls 24, 25 of the cavity 20. The gaps 70 may be formed by removing portions of the dielectric layers 26, 34, 36 of the thermoelectric device 28 that are adjacent to the sidewalls 24, 25. In an embodiment, fewer than all of the dielectric layers 26, 34, 36 may be removed to generate the gaps 70.

Figure 11:
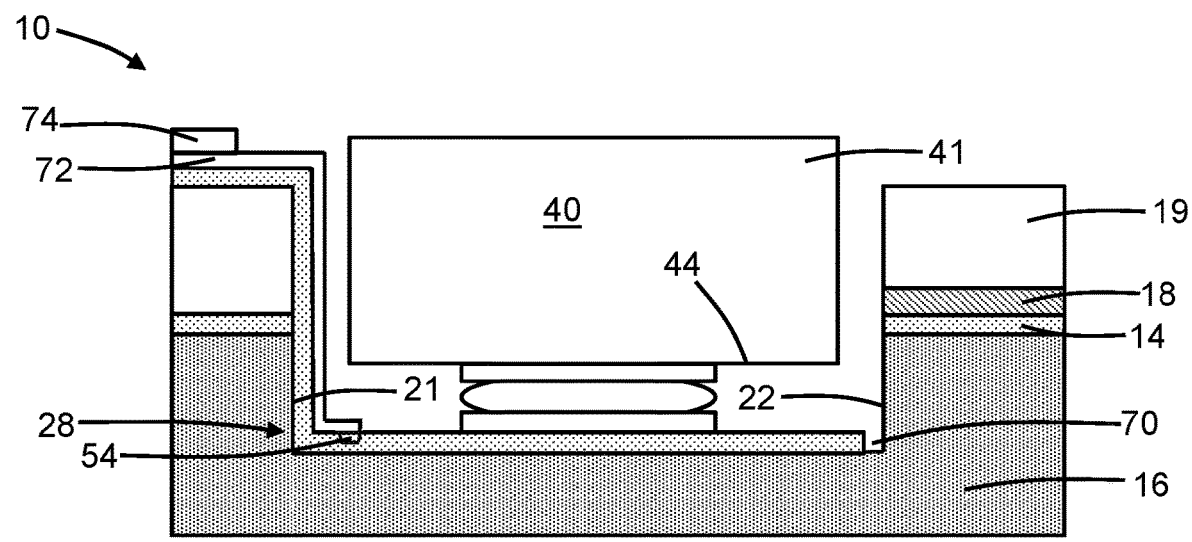
FIG. 11 is a cross-sectional view of a structure in accordance with alternative embodiments of the invention.

With reference to FIG. 11 and in accordance with alternative embodiments, each of the portions of the top connectors 33 at the side edges of the thermoelectric device 28 exposed by the openings 35, 37 may be coupled by a contact via 54 and a redistribution layer 72 to a pad 74. The power supply 45 (FIG. 5) may be coupled to the pads 74 associated with redistribution layers 72. Each redistribution layer 72, which may include a patterned trace comprised of a conductor, such as copper, may extend up the sidewall 21 of the cavity 20 and over the back-end-of-line stack 19, and the pad 74 may be disposed on the back-end-of-line stack 19. The dielectric layers 26, 34, 36 of the thermoelectric device 28 may be disposed on the back-end-of-line stack 19 and may provide a moisture barrier.

Figure 12:
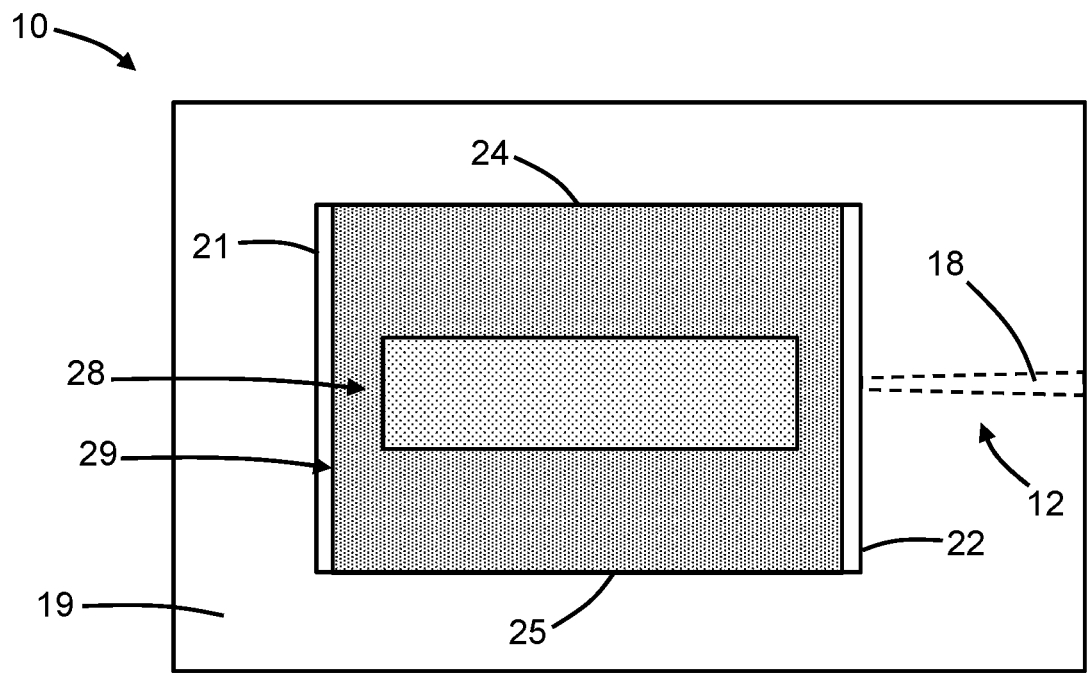
FIG. 12 is a top view of a structure in accordance with alternative embodiments of the invention.

With reference to FIG. 12 and in accordance with alternative embodiments, the structure 10 may be modified to incorporate another thermoelectric device 29 that is similar, or identical, in construction to the thermoelectric device 28.

The laser chip 40 may be attached after the thermoelectric devices 28, 29 are formed. The thermoelectric device 29 may be coupled to a power supply different from the power supply coupled to the thermoelectric device 28.

The thermoelectric device 29 may be configured to have a different cooling power than the thermoelectric device 28. In an embodiment, the thermoelectric device 28 may have a cooling power that is greater than the cooling power of the thermoelectric device 29 and the thermoelectric device 28 may be placed in a region that experiences a higher operating temperature. For example, the thermoelectric device 28 may be centrally positioned to encompass the region inside the cavity 20 that includes the connections provided by the pads 46 and solder joints 50, which may be expected to have a higher operating temperature than adjacent regions within the cavity 20 cooled by the thermoelectric device 29.

Figure 13:
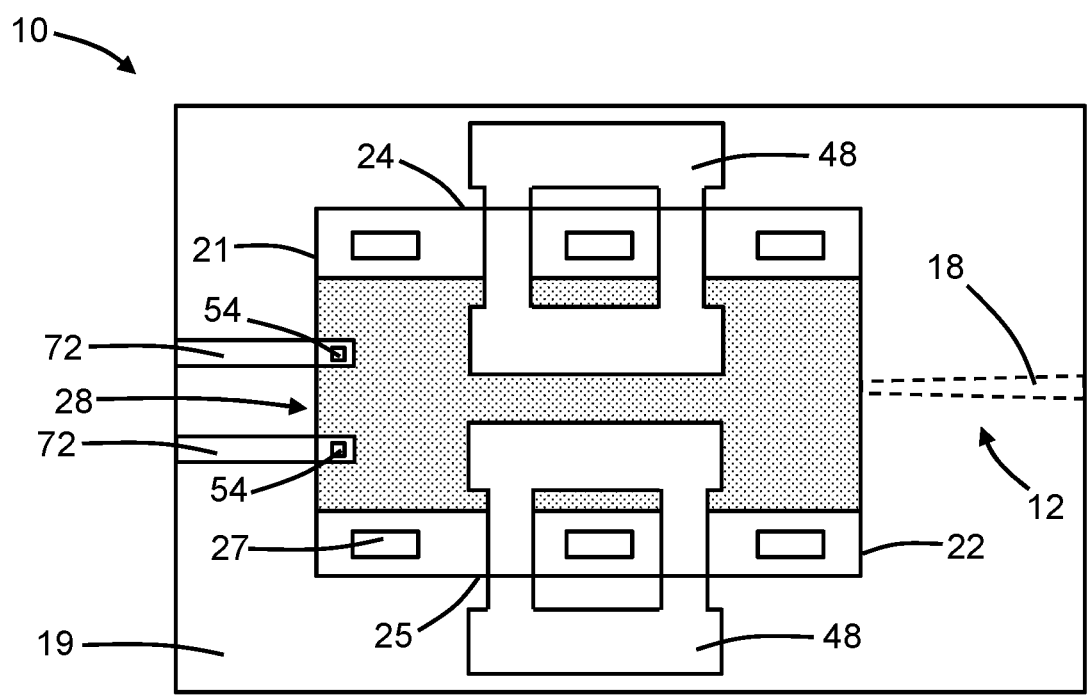
FIG. 13 is a top view of a structure in accordance with alternative embodiments of the invention.

With reference to FIG. 13 and in accordance with alternative embodiments, the redistribution layers 72 coupled by the contact vias 54 to the portions of the top connectors 33 at the side edges of the thermoelectric device 28 may be routed up the sidewall 21 of the cavity 20. The redistribution layers 48 for the laser chip 40 may be routed up the sidewalls 24, 25 of the cavity 20 that are adjacent to the sidewall 21. Mechanical stops 27, which may include patterned portions of the dielectric layer 14, may be arranged adjacent to the opposite sidewalls 24, 25 of the cavity 20 and may be contacted by the attached laser chip 40 to align the output 42 of the laser chip 40 relative to the tapered section 18 of the waveguide core 12.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a substrate including a cavity;
   a first thermoelectric device inside the cavity, the first thermoelectric device including a first dielectric layer, a second dielectric layer, a plurality of connectors, a first plurality of pillars, and a second plurality of pillars that alternate with the first plurality of pillars in a series circuit, the plurality of connectors coupling the first plurality of pillars to the second plurality of pillars in the series circuit, the first plurality of pillars and the second plurality of pillars disposed between the first dielectric layer and the second dielectric layer, the first plurality of pillars comprising an n-type semiconductor material, and the second plurality of pillars comprising a p-type semiconductor material; and
   a chip disposed inside the cavity adjacent to the first thermoelectric device,
   wherein the first dielectric layer includes an opening exposing a portion of one of the plurality of connectors.

2. The structure of claim 1 wherein the chip comprises a laser diode.

3. The structure of claim 2 further comprising:
   a waveguide core including a tapered section disposed adjacent to the laser diode,
   wherein the tapered section of the waveguide core is configured to receive light from the laser diode.

4. The structure of claim 1 wherein the substrate has a top surface, the cavity has a floor and a plurality of sidewalls extending from the floor to the top surface of the substrate, the chip includes a body having a bottom surface, and the first thermoelectric device is disposed between the floor of the cavity and the bottom surface of the body of the chip.

5. The structure of claim 4 wherein the first dielectric layer and the second dielectric layer are spaced from at least one of the plurality of sidewalls by a gap.

6. The structure of claim 1 wherein the first thermoelectric device is disposed inside a first portion of the cavity, and further comprising:
   a second thermoelectric device disposed inside a second portion of the cavity.

7. The structure of claim 1 wherein the n-type semiconductor material comprises bismuth telluride doped with selenium, and the p-type semiconductor material comprises bismuth telluride doped with antimony.

8. The structure of claim 1 wherein the chip is disposed over the first dielectric layer.

9. The structure of claim 1 wherein the first thermoelectric device includes a third dielectric layer between the first dielectric layer and the second dielectric layer, the first plurality of pillars and the second plurality of pillars are disposed in the third dielectric layer, and the plurality of connectors are disposed between the first dielectric layer and the second dielectric layer.

10. A structure comprising:
a substrate including a cavity;
a thermoelectric device inside the cavity, the thermoelectric device including a first dielectric layer, a second dielectric layer, a plurality of connectors, a first plurality of pillars, and a second plurality of pillars that alternate with the first plurality of pillars in a series circuit, the plurality of connectors coupling the first plurality of pillars to the second plurality of pillars in the series circuit, the first plurality of pillars and the second plurality of pillars disposed between the first dielectric layer and the second dielectric layer, the first plurality of pillars comprising an n-type semiconductor material, and the second plurality of pillars comprising a p-type semiconductor material;
a chip disposed inside the cavity adjacent to the thermoelectric device,
a contact via that extends through the first dielectric layer to a portion of one of the plurality of connectors; and
a pad coupled to the contact via.

11. The structure of claim 10 wherein the chip includes a through-silicon via coupled to the series circuit.

12. The structure of claim 10 further comprising:
a first redistribution layer that couples the contact via to the pad.

13. The structure of claim 12 wherein the cavity has a first sidewall, and the first redistribution layer extends up the first sidewall to the pad.

14. The structure of claim 13 wherein the cavity has a second sidewall adjacent to the first sidewall, and further comprising:
a second redistribution layer that is coupled to the chip, wherein the second redistribution layer extends up the second sidewall.

15. The structure of claim 13 wherein the cavity has a second sidewall opposite to the first sidewall, and further comprising:
a waveguide core including a tapered section disposed adjacent to the second sidewall.

16. The structure of claim 10 wherein the chip includes a body having a bottom surface and a pad at the bottom surface, and further comprising:
a redistribution layer on the first dielectric layer; and
a solder joint that couples the pad of the body to a portion of the redistribution layer.

17. The structure of claim 10 wherein the chip comprises a laser diode.

18. The structure of claim 17 further comprising:
a waveguide core including a tapered section disposed adjacent to the laser diode,
wherein the tapered section of the waveguide core is configured to receive light from the laser diode.

19. The structure of claim 10 wherein the thermoelectric device includes a third dielectric layer between the first dielectric layer and the second dielectric layer, the first plurality of pillars and the second plurality of pillars are disposed in the third dielectric layer, and the plurality of connectors are disposed between the first dielectric layer and the second dielectric layer.

20. A method comprising:
forming a cavity in a substrate;
forming a thermoelectric device inside the cavity, wherein the thermoelectric device includes a first dielectric layer, a second dielectric layer, a plurality of connectors, a first plurality of pillars, and a second plurality of pillars that alternate with the first plurality of pillars in a series circuit, the plurality of connectors couple the first plurality of pillars to the second plurality of pillars in the series circuit, the first plurality of pillars and the second plurality of pillars are disposed between the first dielectric layer and the second dielectric layer, the first plurality of pillars comprise an n-type semiconductor material, and the second plurality of pillars comprise a p-type semiconductor material; and
disposing a chip inside the cavity adjacent to the thermoelectric device,
wherein the first dielectric layer includes an opening exposing a portion of one of the plurality of connectors.

* * * * *